(12) United States Patent
Syllaios et al.

(10) Patent No.: US 9,319,051 B2
(45) Date of Patent: Apr. 19, 2016

(54) DIGITAL PLL WITH HYBRID PHASE/FREQUENCY DETECTOR AND DIGITAL NOISE CANCELLATION

(71) Applicant: Broadcom Corporation, Irvine, CA (US)

(72) Inventors: Ioannis Loukas Syllaios, Costa Mesa, CA (US); Henrik Tholstrup Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 34 days.

(21) Appl. No.: 14/283,652

(22) Filed: May 21, 2014

(65) Prior Publication Data
US 2014/0354336 A1 Dec. 4, 2014

Related U.S. Application Data

(63) Continuation-in-part of application No. 13/966,515, filed on Aug. 14, 2013, now abandoned.

(60) Provisional application No. 61/856,278, filed on Jul. 19, 2013, provisional application No. 61/828,108, filed on May 28, 2013.

(51) Int. Cl.
*H03L 7/093* (2006.01)
*H03L 7/107* (2006.01)
*H03L 7/193* (2006.01)

(52) U.S. Cl.
CPC .............. *H03L 7/093* (2013.01); *H03L 7/1075* (2013.01); *H03L 7/193* (2013.01)

(58) Field of Classification Search
CPC ......... H03L 7/085; H03L 7/087; H03L 7/089; H03L 7/081; H03L 7/093; H03L 7/091; H03L 7/095; H03L 7/0891
USPC .......... 327/147, 156, 158, 161; 375/371, 375, 375/376
See application file for complete search history.

(56) References Cited

U.S. PATENT DOCUMENTS

| 8,076,978 B2* | 12/2011 | Da Dalt ................... H03L 7/16 331/1 A |
| 2007/0030939 A1* | 2/2007 | Gazsi .................... H03L 7/0991 375/376 |
| 2013/0002459 A1 | 1/2013 | Meacham et al. |
| 2013/0113528 A1* | 5/2013 | Frantzeskakis ........... H03L 7/10 327/117 |

FOREIGN PATENT DOCUMENTS

EP          1331741 B1    10/2006

OTHER PUBLICATIONS

Sandireddy, Raja K.K.R., et al., "A Generic Architecture for Multi-Modulus Dividers in Low-Power and High-Speed Frequency Synthesis," 2004 Topical Meeting on Silicon Monolithic Integrated Circuits in RF Systems, Sep. 2004, 4 pages.

* cited by examiner

*Primary Examiner* — John Poos
(74) *Attorney, Agent, or Firm* — Brinks Gilson & Lione

(57) ABSTRACT

Digital phase-locked loop (PLL) with dynamic hybrid (mixed analog/digital signal) delta-sigma ($\Delta\Sigma$) phase/frequency detector ($\Delta\Sigma$ PFD). A hybrid 2nd-order $\Delta\Sigma$ PFD may be implemented based on a continuous-time 1st-order $\Delta\Sigma$ analog-to-digital converter (ADC) enhanced to 2nd-order via closed loop frequency detection. Fine resolution encoding of the $\Delta\Sigma$ PFD output facilitates true multi-bit phase/frequency error digitization with drastically reduced $\Delta\Sigma$ quantization noise. The implementation of low complexity $\Delta\Sigma$ PFD is assisted via digital requantization and adaptive noise cancellation. The PLL includes independent frequency-locking and phase-locking operational modes and all-digital control of a digitally controlled oscillator (DCO).

21 Claims, 15 Drawing Sheets

US 9,319,051 B2

DIGITAL PLL WITH HYBRID PHASE/FREQUENCY DETECTOR AND DIGITAL NOISE CANCELLATION

PRIORITY CLAIM

This application claims the benefit of and is a continuation in part of U.S. Non-provisional application Ser. No. 13/966,515, filed 14-Aug.-2013, which claims the benefit of priority to U.S. Provisional Application No. 61/828,108, filed 28-May-2013 and the benefit of priority to U.S. Provisional Application No. 61/856,278, filed 19-Jul.-2013, all of which are entirely incorporated by reference.

TECHNICAL FIELD

This disclosure relates to phase locked loops (PLLs).

BACKGROUND

Rapid advances in electronics and communication technologies, driven by immense customer demand, have resulted in the widespread adoption of an extensive variety of electronic devices. These devices often rely for proper operation on sophisticated frequency synthesizers, clock recovery circuits, jitter and noise reduction circuits and other types of circuits that are sometimes implemented with phase locked loops (PLLs). Improvements in PLLs will further enhance the performance of electronic devices.

DETAILED DESCRIPTION

Figure 1:
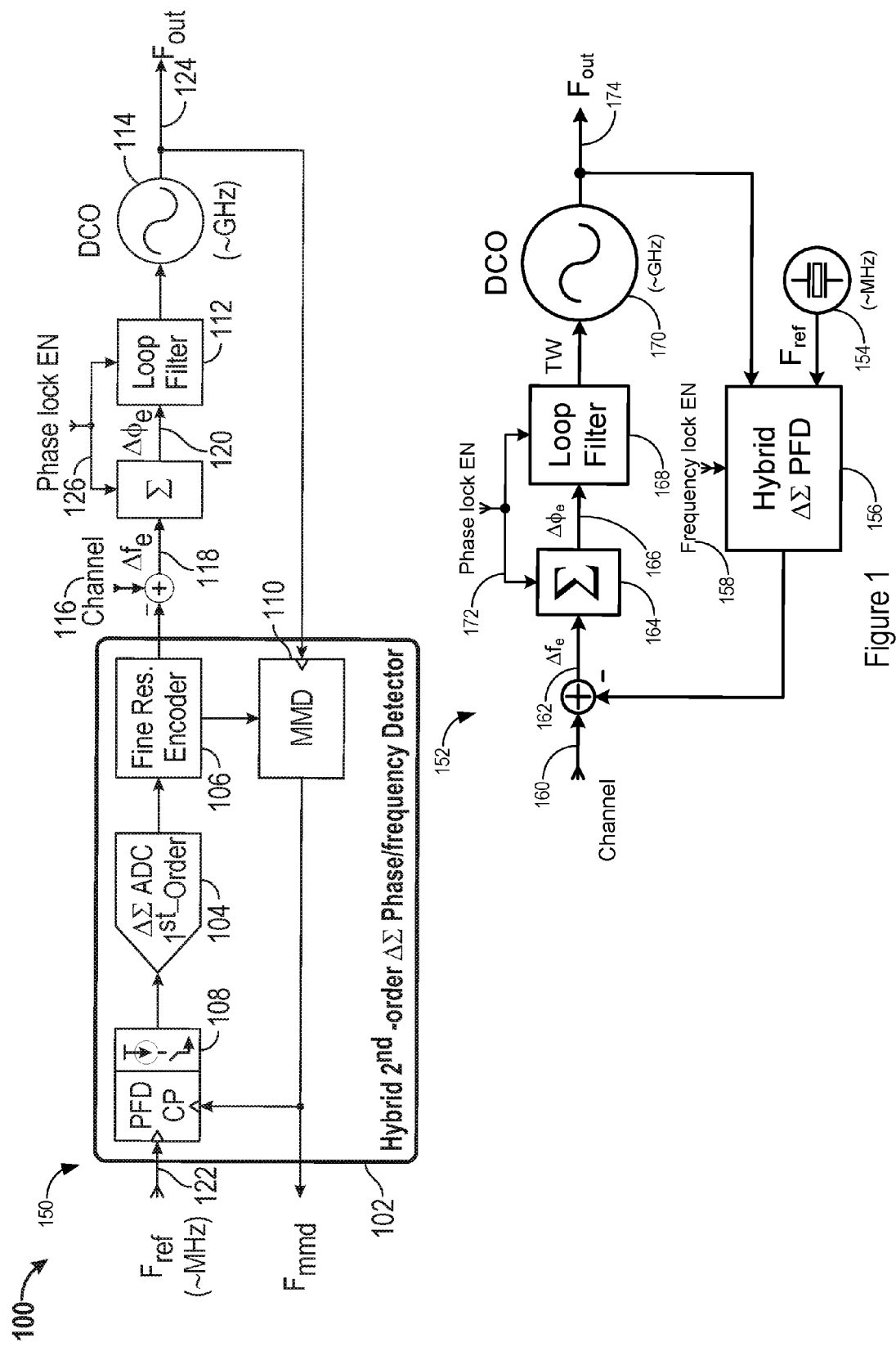
FIG. 1 shows an example of a PLL.

FIG. 1 shows an example of a PLL 100, including first example architecture 150 and a second example architecture 152. The PLL 100 includes independent frequency-locking and phase-locking operational modes. In addition, the PLL 100 includes a hybrid (e.g., mixed-analog/digital signal) 2nd-order delta-sigma ($\Delta\Sigma$) phase/frequency detector (PFD) 102 ("detector 102"). The detector 102 may be implemented, for example, using a continuous-time 1st-order $\Delta\Sigma$ Analog to Digital Converter (ADC) 104, enhanced to 2nd-order via, e.g., closed loop frequency detection.

Figure 7:
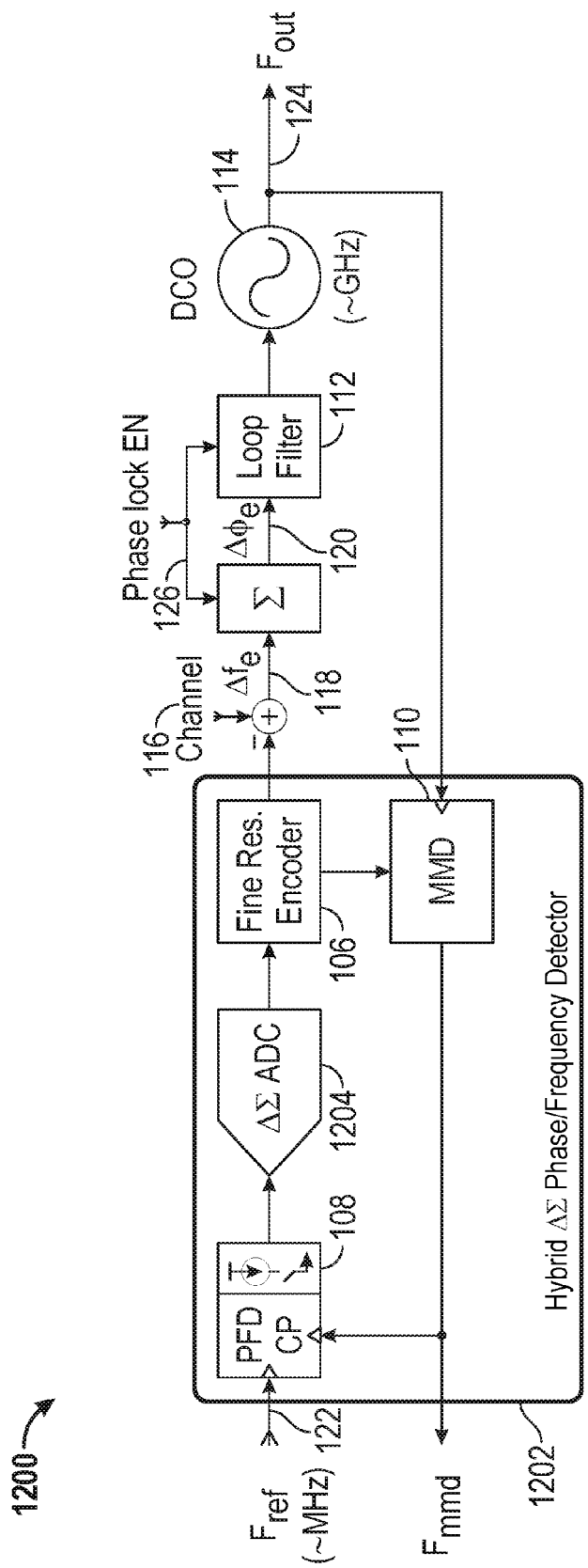
FIG. 7 shows another example PLL.

The PLL 100 and its component parts may be implemented in other ways and may vary in performance characteristics from implementation to implementation. For example, FIG. 7 shows another example PLL 1200. In the example of FIG. 7, a hybrid $\Delta\Sigma$ phase/frequency detector 1202 is present, as is a $\Delta\Sigma$ ADC 1204 which is not necessarily 1st-order.

The PLL 100 includes a fine resolution (FineRes) encoder 106 for encoding the $\Delta\Sigma$ ADC output. The fine resolution encoding facilitates true multi-bit phase/frequency error digitization with drastically reduced $\Delta\Sigma$ quantization noise. A phase/frequency detector charge pump (CP) 108 front-end drives the ADC 104, and a multi-modulus divider (MMD) 110 is present in the feedback path from the digital loop filter.

The PLL 100 also includes coarse and fine resolution detection modes that facilitate fast acquisition and spur-free tracking operation. A fully digital loop filter 112 may be implemented in the PLL 100 and may control the digitally controlled oscillator (DCO) 114. Note that the PLL 100 has a bandwidth determined by the loop filter coefficients independent of the $\Delta\Sigma$ phase/frequency detector parameters (e.g., CP current $I_{cp}$ and the 1st-order $\Delta\Sigma$ ADC integrating capacitor $C_{int}$).

The PLL 100 operates on the differential phase/frequency error of its output clock signal $F_{out}$ with respect to the input reference clock signal 122, $F_{ref}$. The output frequency of the PLL output clock 124, $F_{out}$, reflects the targeted channel frequency upon phase/frequency lock. The detector 102 provides a digital estimate of the PLL output frequency the PLL 100 may compare to a digital word (e.g., a channel indicator 116) that specifies the targeted channel frequency for the PLL 100 to produce. The digital frequency error information ($\Delta f_e$) 118 is accumulated (e.g., integrated) to provide the digital phase error information ($\Delta phi_e$) 120. The PLL 100 controls the phase/frequency of the DCO 114 responsive to the digital frequency error information, e.g., to try to eliminate the error. A phase lock enable signal 126 may be provided to selectively enable or disable the operation of the accumulation and filter operations of the PLL 100.

Note that the loop filter configuration is independent of the fine resolution encoder 106. Without the fine resolution encoder 106, loop filter may instead be characterized by a low bandwidth and high rejection (that may result in less stable output) so that distortion due to the coarse resolution quantization is adequately filtered. The fine resolution encoder 106 thus allows for more flexible PLL dynamic control.

FIG. 1 also shows the second example architecture 152. A frequency source 154 (e.g., a crystal oscillator) provides the input reference clock signal, $F_{ref}$ to a $\Delta\Sigma$ PFD 156 (which is not necessarily second order, as in the first example architecture 150), and a frequency lock enable signal 158 may enable or disable the $\Delta\Sigma$ PFD 156. The output of the $\Delta\Sigma$ PFD 156 provides a feedback combined with the channel indicator 160 to generate the digital frequency error information 162.

An accumulator 164 accumulates the digital frequency error information ($\Delta f_e$) 162 (e.g., by integration) to provide the digital phase error information ($\Delta phi_e$) 166. The loop filter 168 filters the digital phase error information. The second example architecture 152 controls the phase/frequency of the DCO 170 responsive to the digital frequency error information, e.g., to try to eliminate the error. A phase lock enable signal 172 may be provided to selectively enable or disable the operation of the accumulation and filter operations of the PLL. The DCO 170 generates a frequency output 174.

Figure 2:
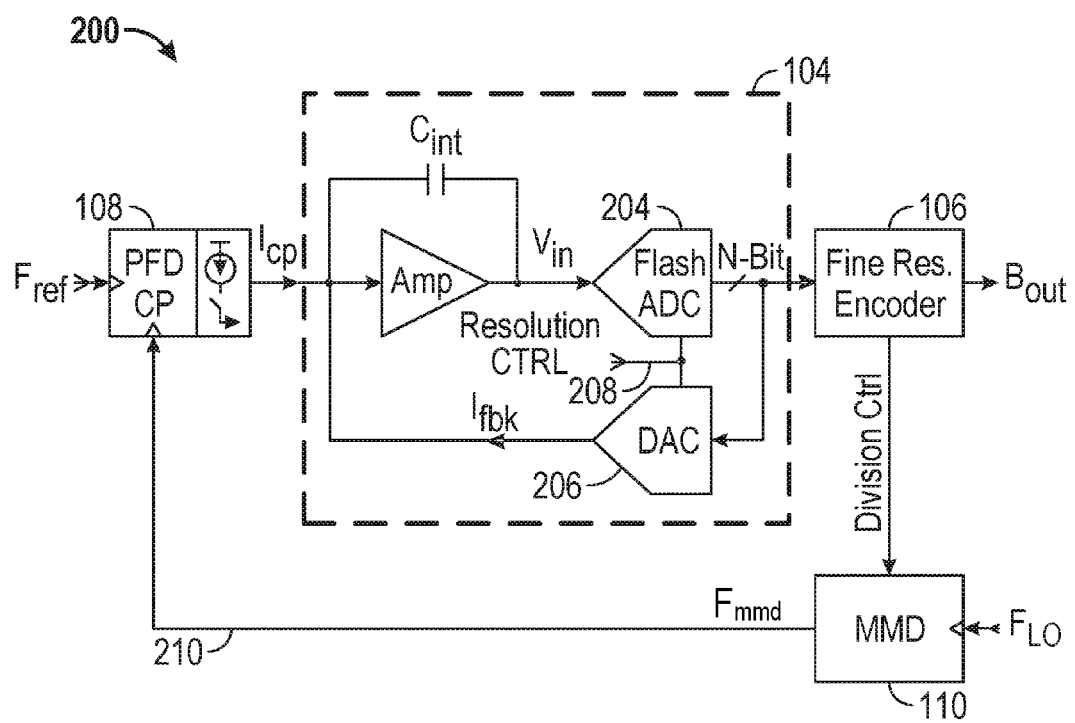
FIG. 2 is an example of a hybrid 2nd-order delta sigma phase/frequency detector.

FIG. 2 is an example of a hybrid 2nd-order delta sigma phase/frequency detector ("detector") 200 that may be used in the PLL 100, and also shows in more detail the ADC 104. The voltage developed across $C_{int}$ reflects the phase error between the reference clock ($F_{ref}$) and the divided local oscillator (LO) clock ($F_{mmd}$) on the divider output 210. The negative feedback loop around $C_{int}$ dynamically conditions charge accumulation and in the absence of overloading the detector self-calibrates Direct Current (DC) offsets. The closed loop noise shaping functionality of the detector 200 allows for low $I_{cp}$ which directly translates to small $C_{int}$ values, e.g., a few pico Farad (pF), with $C_{int}$ a function of $I_{cp}$ and $F_{ref}$, e.g., $C_{int}$~$f(I_{cp}/F_{ref})$.

The flash ADC 204 and current-mode DAC 206 of the ADC 104 is digitally reconfigurable to support single-bit or multi-bit resolution via dynamic control of the number of active quantization levels, allowing for fast frequency acquisition and spur-free tracking operation. In that regard, the PLL 100 may include a resolution control input 208 that specifies, e.g., the number of quantization levels that the ADC 104 will generate. As a specific example, the resolution control input 208 may be provided to both the flash ADC 204 and the current-mode DAC 206 to configure them for the number of quantization levels desired. A controller may use the resolution control input 208 to place the PLL 100 into single-bit or three level quantization mode for coarse resolution operation of the PLL 100, while the controller may cause multi-bit quantization for fine resolution operation of the PLL 100. The controller may switch to fine resolution operation on an application specific basis, and as one example the switch to fine resolution may depend upon the time for the frequency error to settle to within a predefined margin. To the extent that there are mismatches in the flash ADC 204 and current-mode DAC 206 characteristics, those mismatches may be randomized via the closed-loop noise shaping functionality of the detector 200, thereby alleviating any need for dynamic element matching (DEM). However, as noted below with respect to FIG. 3, DEM may also be included.

Figure 3:
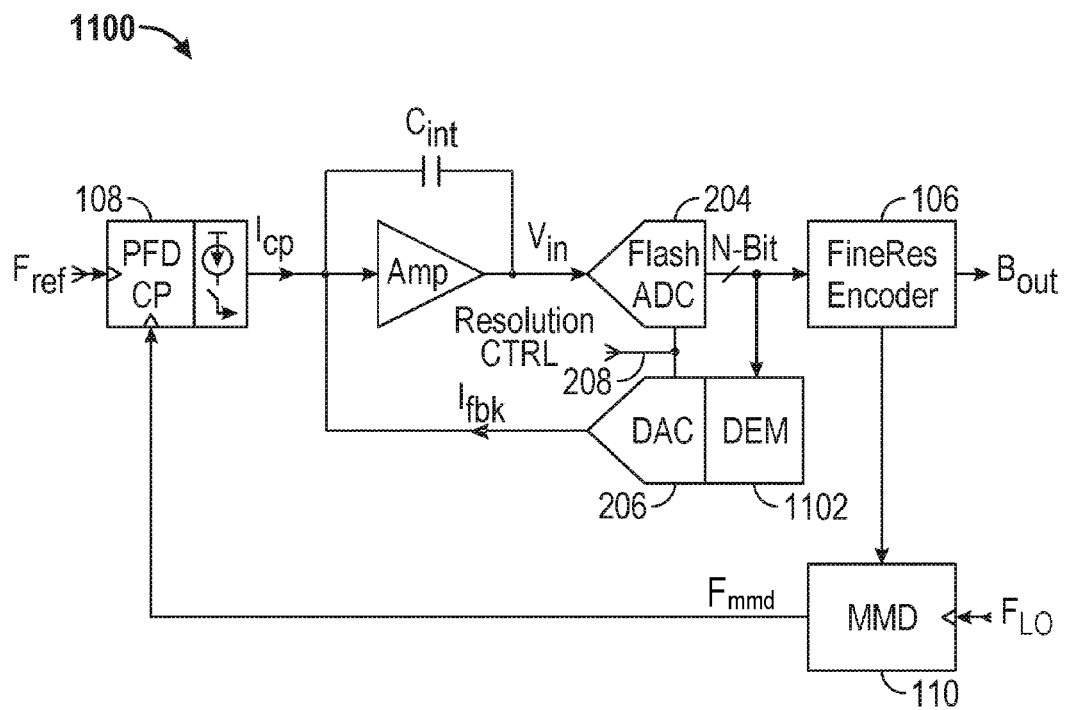
FIG. 3 shows an example of dynamic element matching used in connection with a Digital to Analog Converter (DAC) in a detector such as that of FIG. 2.

FIG. 3 shows an example of a detector 1100 that uses optional dynamic element matching in connection with a Digital to Analog Converter (DAC). In particular, the Dynamic Element Matching (DEM) circuitry 1102 is associated with (e.g., incorporated into) the current-mode DAC 206. In the DAC 206 a series of unit current sources may generate the analog output. However, due to the normal variations in the fabrication processes, each unit current source is not exactly the same, and each may vary slightly from each other current source. The dynamic element matching circuitry 1102 may be present to help eliminate the mismatches as a source of error. The dynamic element matching circuitry 1102 may implement, for example, the randomized use of the unit current sources in order to make the error resulting from their mismatches appear to be pseudorandom noise (e.g., white noise) that is uncorrelated with the input.

Figure 4:
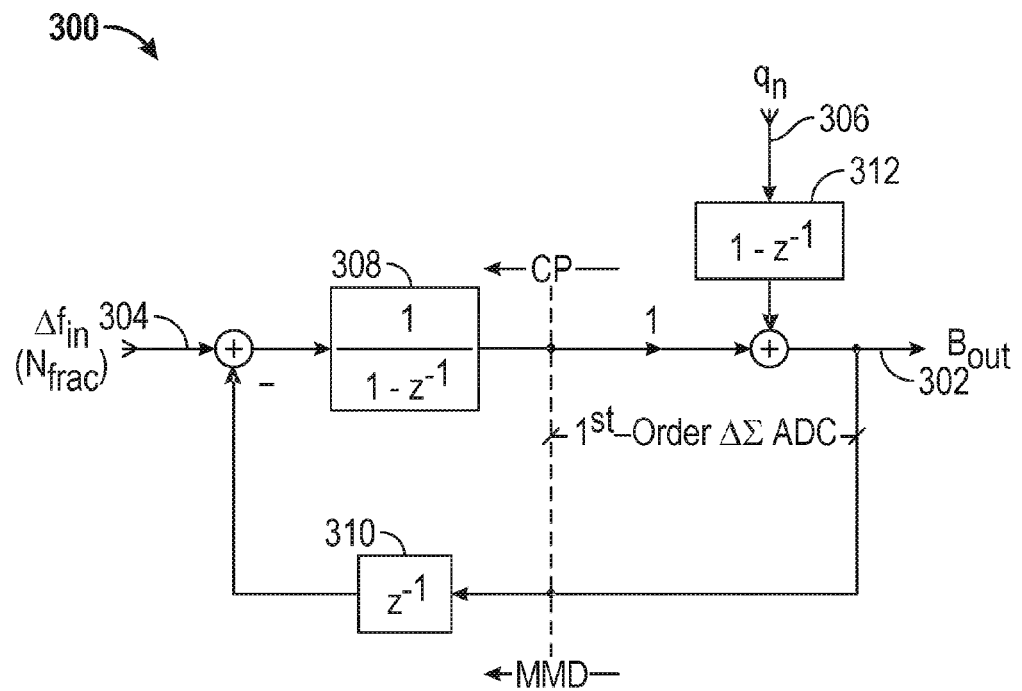
FIG. 4 is an example of a normalized discrete-time delta sigma detector model.

FIG. 4 is an example of a normalized discrete-time delta sigma detector model 300. The MMD 110 divides $F_{LO}$ by a sequence of integer factors of the form:

$$N_{int} + \{\ldots, -1, 0, 1, \ldots\}$$

and thereby achieves a long-term average fractional N value, where:

$$N = N_{int} + N_{frac} = F_{LO}/F_{ref} \text{ and } N_{frac} \in [0,1) \text{ or } [-\frac{1}{2}, \frac{1}{2}).$$

The mean value of the detector output $B_{out}$ 302 is preferably $N_{frac}$ in order to minimize the frequency error between $F_{ref}$ and $F_{mmd}=F_{LO}/(N_{int}+N_{frac})$. The fractional division control results in $N_{frac}$ cycle-to-cycle period variations of $F_{mmd}$, which entail a $N_{frac}$ LO cycles normalized differential frequency Delta $f_{in}$ input 304 to the ΔΣ detector.

Delta $f_{in}$ ($N_{frac}$) 304 and the induced 1st-order ΔΣ ADC quantization noise $Q_n$ 306 are transferred to the detector output 302 as:

$$B_{out} = \Delta f_{in} + (1-z^{-1})^2 Q_n = N_{frac} + (1-z^{-1})^2 Q_n$$

Note that the induced quantization noise undergoes 2nd-order highpass shaping.

In FIG. 4, the z-domain transfer function 308 represents the sampled physical integration of frequency error reflected on the pulse-width modulated CP output current (hence ←CP), in response to the previous (equation 310) output sample of the ΔΣ ADC output fed to the MMD control (hence ←MMD), and the equation 312 represents 1st-order highpass quantization noise shaping functionality of the ΔΣ ADC.

Figure 5:
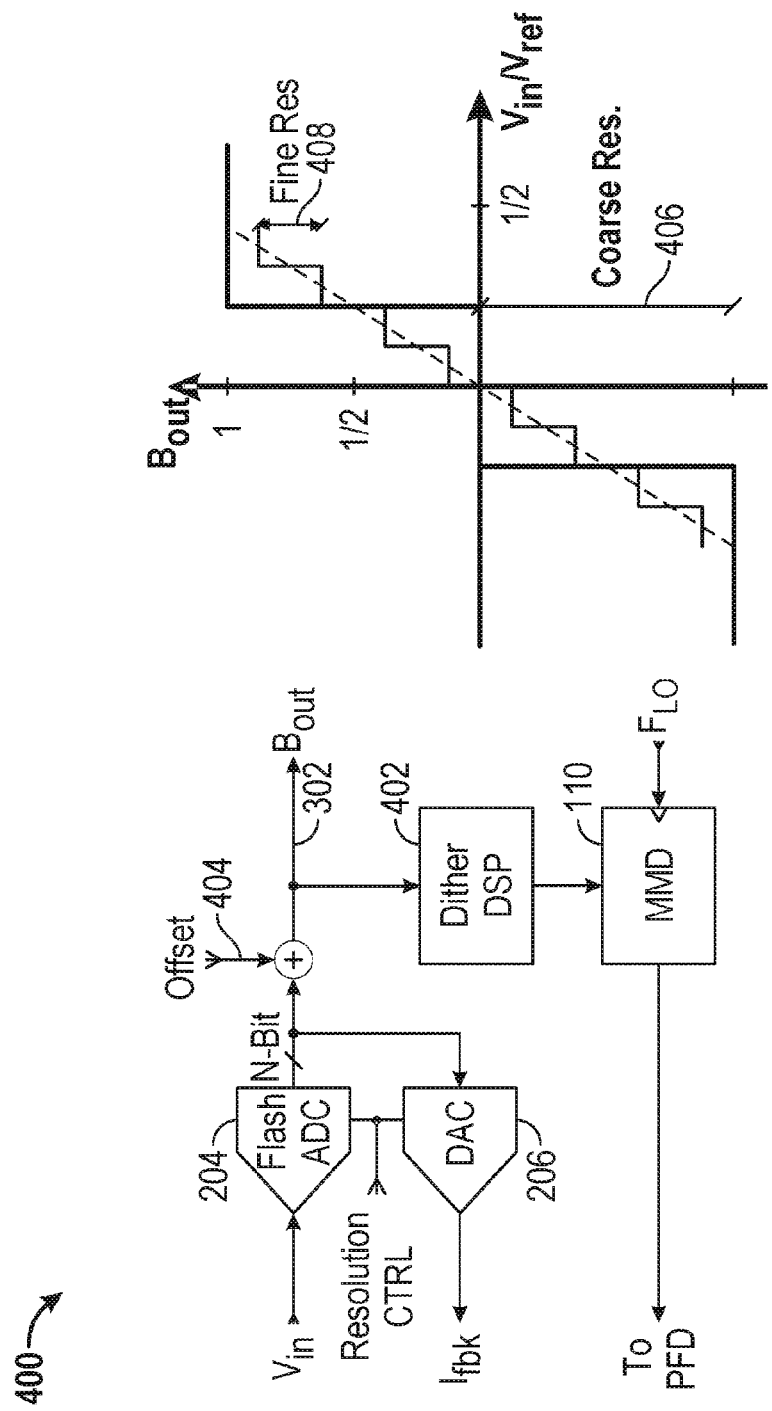
FIG. 5 shows an example of a fine resolution encoder.

FIG. 5 shows an example of a fine resolution encoder circuit 400 that may be used in the PLL 100. For integer only MMD control a suitable coarse quantization step for the 1st-order ΔΣ ADC is Δ=1 and a mid-tread three-level quantizer {−1,0,1} may suffice to produce the $N_{frac}$ values. Additional levels may not improve performance because it may be difficult or impossible to further reduce the induced quantization noise power (which is on the order of $\Delta^2/12$ in this implementation example).

FIG. 5 also illustrates the difference between coarse resolution encoding 406 and fine resolution encoding 408. Increasing the ADC 204 resolution reduces the quantization noise power of the hybrid ΔΣ PFD which in turn directly benefits the PLL 100 performance. For example it allows the PLL 100 to operate with wider bandwidth setting for more stable tracking and higher rejection of the DCO phase noise. The ADC resolution can be increased to support multi-bit (fine) resolution (i.e., Delta (Δ)<1) when integer only MMD control is maintained. The PLL 100 may achieve increased ADC resolution with concurrent re-encoding of the ADC output. The re-encoding may be, for example, to integer only valued control through dither Digital Signal Processing (DSP) operations, such as a digital Multi-Stage Noise Shaping (MASH) (e.g., a MASH-III) ΔΣ modulator implemented with the dither DSP 402. Preferably, the dither DSP does not degrade the 2nd-order ΔΣ noise shaping characteristics of the detector 102. The detector capability to dynamically self-calibrate DC offsets allows the 1st-order ΔΣ ADC quantizer input voltage to be maintained at a predetermined DC level after proper digital output offsetting. The digital offset input 404 provides better control for preventing quantizer overloading and maintaining uniform ADC operation across all channels (i.e., all $N_{frac}$ values).

Figure 6:
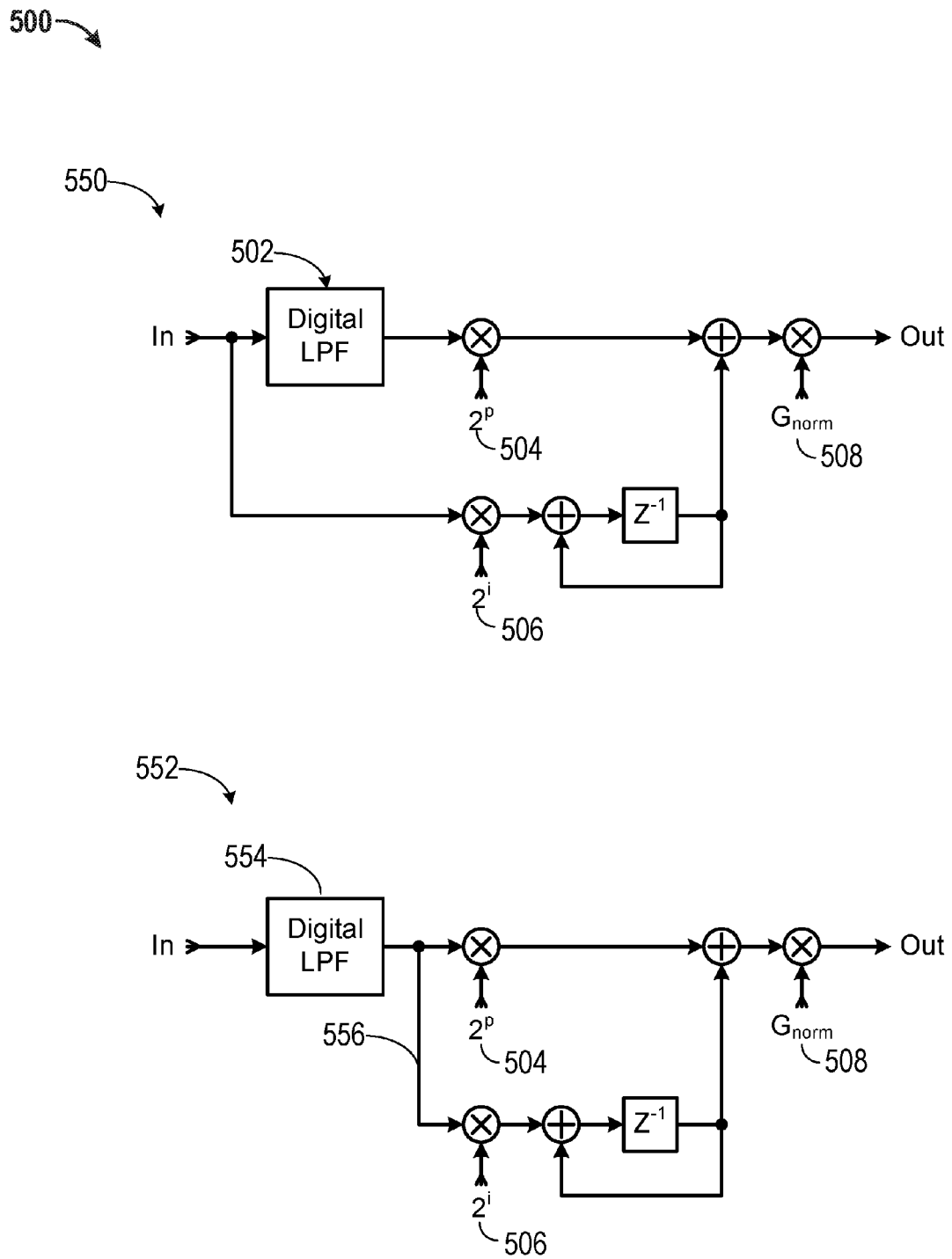
FIG. 6 is an example of a digital loop filter and hybrid digital (HD) PLL dynamic control.

FIG. 6 provides two examples of digital loop filters 500 for the dynamic control of the hybrid digital (HD) PLL: the first example loop filter 550 and the second example loop filter 552. The digital loop filters 500 are possible implementations of the loop filter 112 and 168, with reference again to FIG. 1. The digital loop filters 500 may include proportional-plus-Integral (P+I) control for type-II operation, e.g., so that the phase error between the output clock signal and the reference clock signal is approximately zero. They may also include a digital Low Pass Filter (LPF) that facilitates achieving high rejection of the ΔΣ PFD quantization noise. The digital LPF can be implemented in the form of cascaded single-pole IIR filters.

In the loop filters 500, the HDPLL loop gain may be normalized via the gain normalization ($G_{norm}$) factor 508. The gain normalization factor 508 may decouple the HDPLL dynamic operation from process, voltage, temperature (PVT) dependent parameters such as the DCO gain. The PLL 100 may implement filter coefficients (e.g., 504, 506) that are powers of two, and therefore facilitate digital hardware implementation, e.g., as digital bit-shifting operations. None of the factors, including the gain normalization factor $G_{norm}$ 508, need to be a power of two, however. The digitally intensive HDPLL dynamic control facilitates on-demand bandwidth control, sometimes referred to as gear shifting. The digital dynamic control also facilitates effective addressing of parasitic spurious noise, e.g., injected via the power supplies or coupling between the DCO and the crystal (Xtal) reference.

The hybrid delta sigma phase/frequency detector ($\Delta\Sigma$ PFD) of PLL 100 may be implemented with other optional features. For instance, it may include digital re-quantization, adaptive noise filtering, or both. In some implementations, the hybrid $\Delta\Sigma$ PFD may include a multiple bit flash ADC, with a corresponding DAC that operates on fewer bits facilitating less complex DEM for the DAC and with a low complexity dither DSP that has relaxed digital noise performance. The reduction in the complexity of the DAC and dither DSP facilitates implementation in less silicon area with lower latency digital hardware.

Figure 8:
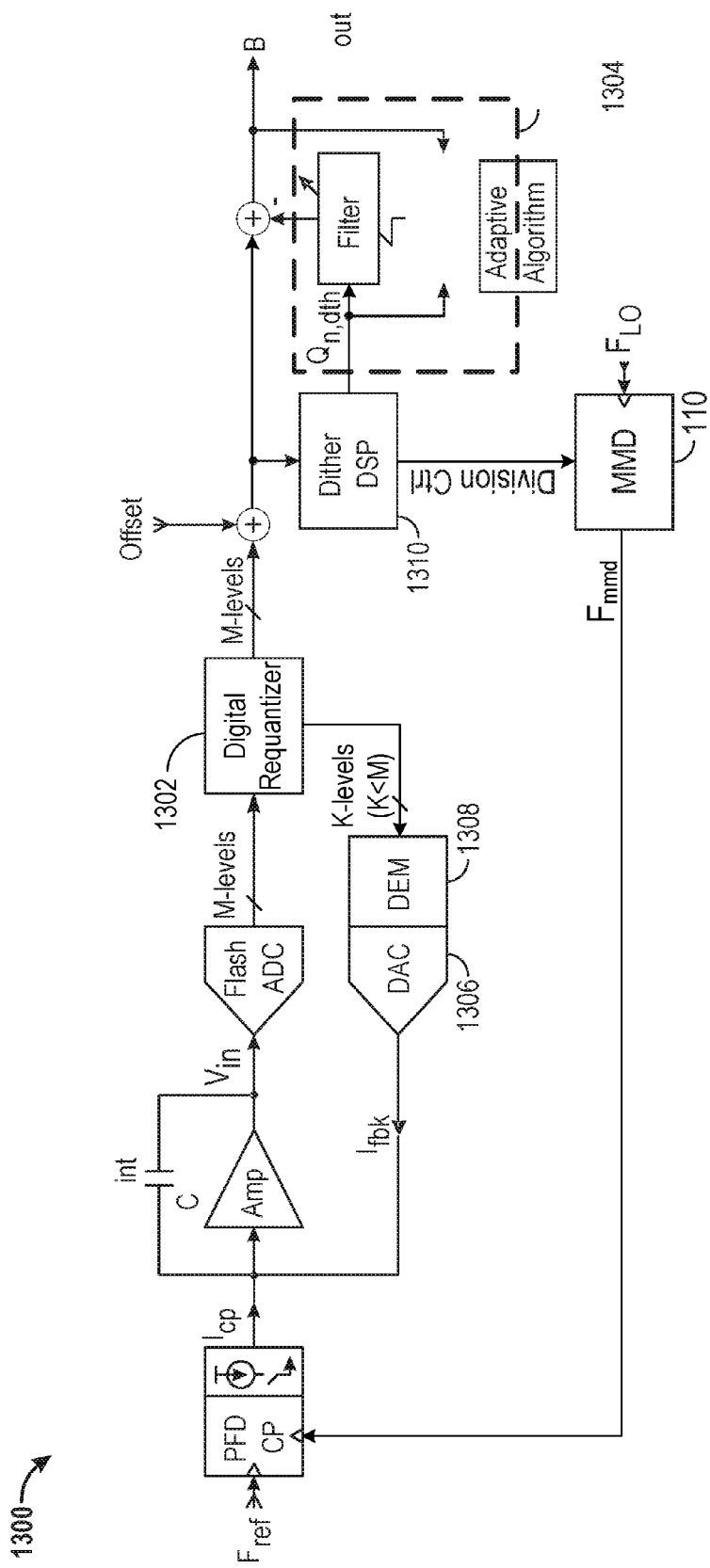
FIG. 8 shows an example of a hybrid 2nd-order delta sigma phase/frequency detector that includes digital requantizer and adaptive noise filtering and cancellation.

FIG. 8 shows a hybrid 2nd-order $\Delta\Sigma$ PFD 1300 that may be used in PLL 100 with reference to FIG. 1 that includes a digital requantizer 1302 and an adaptive filter 1304. The detector 1300 is a hybrid (mixed-analog/digital signal) 2nd-order $\Delta\Sigma$ PFD based on a continuous-time 1st-order $\Delta\Sigma$ ADC enhanced to 2nd-order via closed-loop frequency detection. The digital requantizer 1302 converts 'M' input levels into 'K' output levels, with K<M. 'K' may be as small as 2, for instance, in which case the DAC 1306 is linear and the DEM 1308 omitted. The reduction facilitates a lower complexity DAC 206 and DEM 1308 implementation. The reduction in complexity results in less silicon area used to implement the DAC 1306 and DEM 1308, as well as reduced DEM 1308 latency.

In some implementations, a high flash ADC resolution enhances the performance of the hybrid $\Delta\Sigma$ PFD, and as a result, the PLL uses a high resolution current mode DAC in the feedback path of the $\Delta\Sigma$ ADC. To address negative effects that may be associated with analog component mismatches in the feedback DAC, the PLL may include dynamic element matching (DEM) to noise shape mismatch errors. Increasing the number of DAC quantization levels (e.g., beyond five) may result in considerable increases to the complexity of the DEM algorithm, and impose latency constraints.

To reduce the feedback DAC and related DEM algorithm complexity to up to several quantization levels (e.g., up to five), the fine M-level flash ADC output is temporarily re-quantized to a coarser K-level grid to drive the feedback DAC. The resulting re-quantization error is properly recombined with the flash ADC output to restore M-level resolution. A digital noise shaping requantizer is utilized so that the re-quantization error does not mask the noise shaping performance of the $\Delta\Sigma$ ADC (e.g., 1st-order).

The adaptive filter 1304 provides adaptive cancellation of known noise affecting the dither DSP 1310 and hybrid $\Delta\Sigma$ PFD. The adaptive cancellation helps to achieve wide PLL bandwidth. In turn, a wide PLL bandwidth provides more stable tracking and higher rejection of the DCO phase noise which allows for relaxed DCO power consumption. The adaptive filter 1304 may be implemented as described below with regard to FIG. 9, or in other manners.

Figure 9:
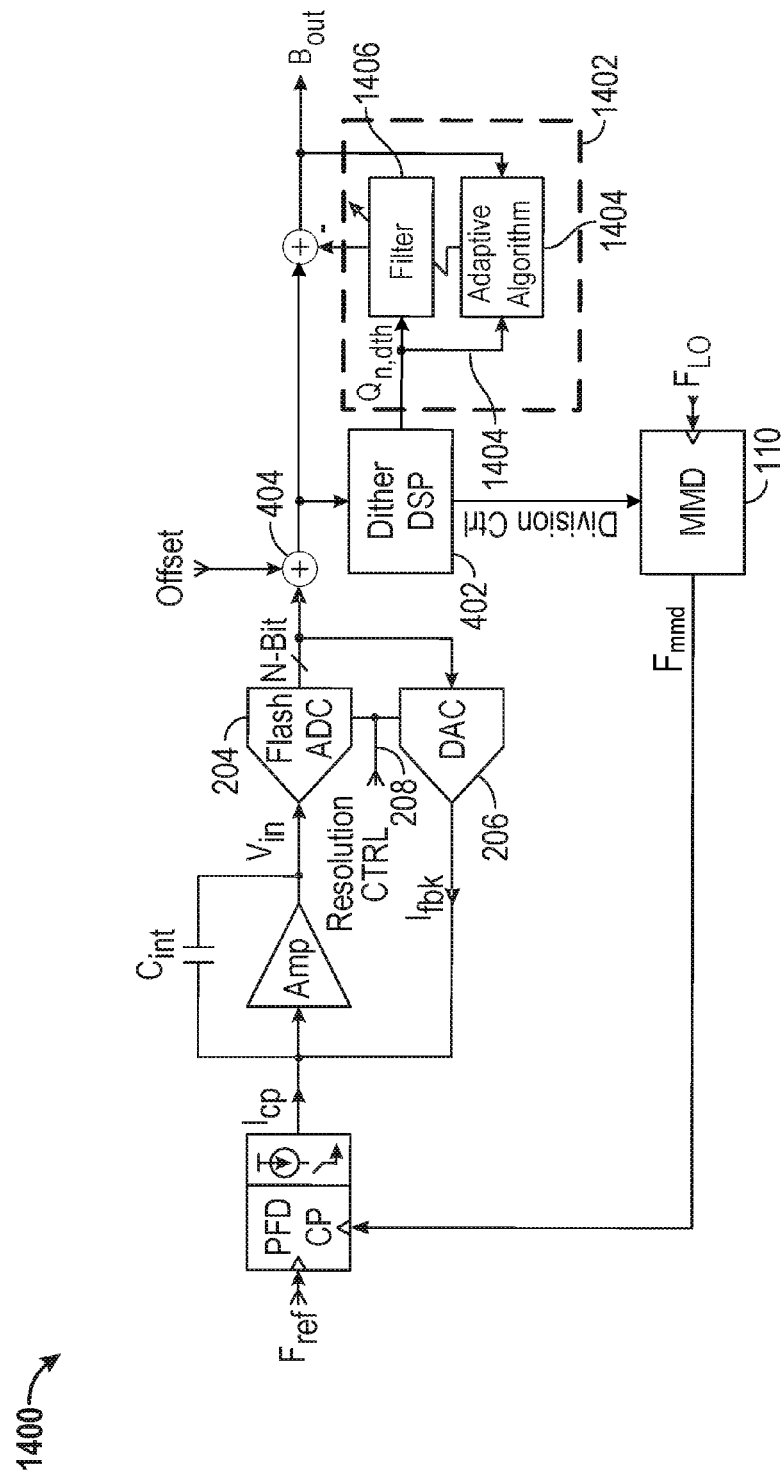
FIG. 9 shows an example of a hybrid 2nd-order delta sigma phase/frequency detector that includes adaptive noise filtering and cancellation.

FIG. 9 shows an example of a hybrid 2nd-order $\Delta\Sigma$ PFD 1400 that may be used in PLL 100 with reference to FIG. 1 that includes adaptive noise filtering and cancellation. The detector 1400 is a hybrid (mixed-analog/digital signal) 2nd-order $\Delta\Sigma$ PFD based on a continuous-time 1st-order $\Delta\Sigma$ ADC enhanced to 2nd-order via closed-loop frequency detection. In the example of FIG. 9, the fine resolution encoder includes an adaptive filter 1402. The adaptive filter 1402 includes an adaptive algorithm 1404 that makes adjustments to the filter coefficients in the filter 1406. As examples, the adaptive algorithm 1404 may be a Least Mean Squares (LMS) or Recursive Least Squares (RLS) algorithm. The filter 1406 may be a digital Finite Impulse Response (FIR) filter or a digital Infinite Impulse Response (IIR) filter, as examples.

Note that in fine resolution (FineRes) detection mode, the ADC 204 is configured to produce multi-bit phase/frequency error digitization with drastically reduced $\Delta\Sigma$ quantization noise, according to its resolution ($\Delta<1$). The dither DSP 402 interfaces the high-resolution ADC output to the lower-resolution grid of the MMD control (e.g., through a digital $\Delta\Sigma$ modulator). Detector linearity requirements often calls for small valued integer MMD control span (e.g., in the range [−3, +3]), which in turn may limit the available choices of low-complexity noise-shaping dither DSP topologies. In such cases a low-order dither DSP may be used (e.g., a dither DSP with 3rd-order $\Delta\Sigma$ noise shaping characteristics). The adaptive filter 1402 may cancel out the noise contribution from the dither DSP to the hybrid $\Delta\Sigma$ PFD output $B_{out}$ by utilizing the readily available digital quantization noise signal $Q_{n,dth}$ 1404.

As another benefit, the adaptively configured filter 1406 captures the dynamic performance of the hybrid $\Delta\Sigma$ PFD as seen by the dither DSP induced quantization noise $Q_{n,dth}$ to the detector output $B_{out}$. In other words, the adaptation of the filter 1406 reveals additional information about the dynamic performance of the hybrid $\Delta\Sigma$ PFD. The information may be used in other systems to understand and make further adaptations to the performance of the hybrid $\Delta\Sigma$ PFD.

Figure 10:
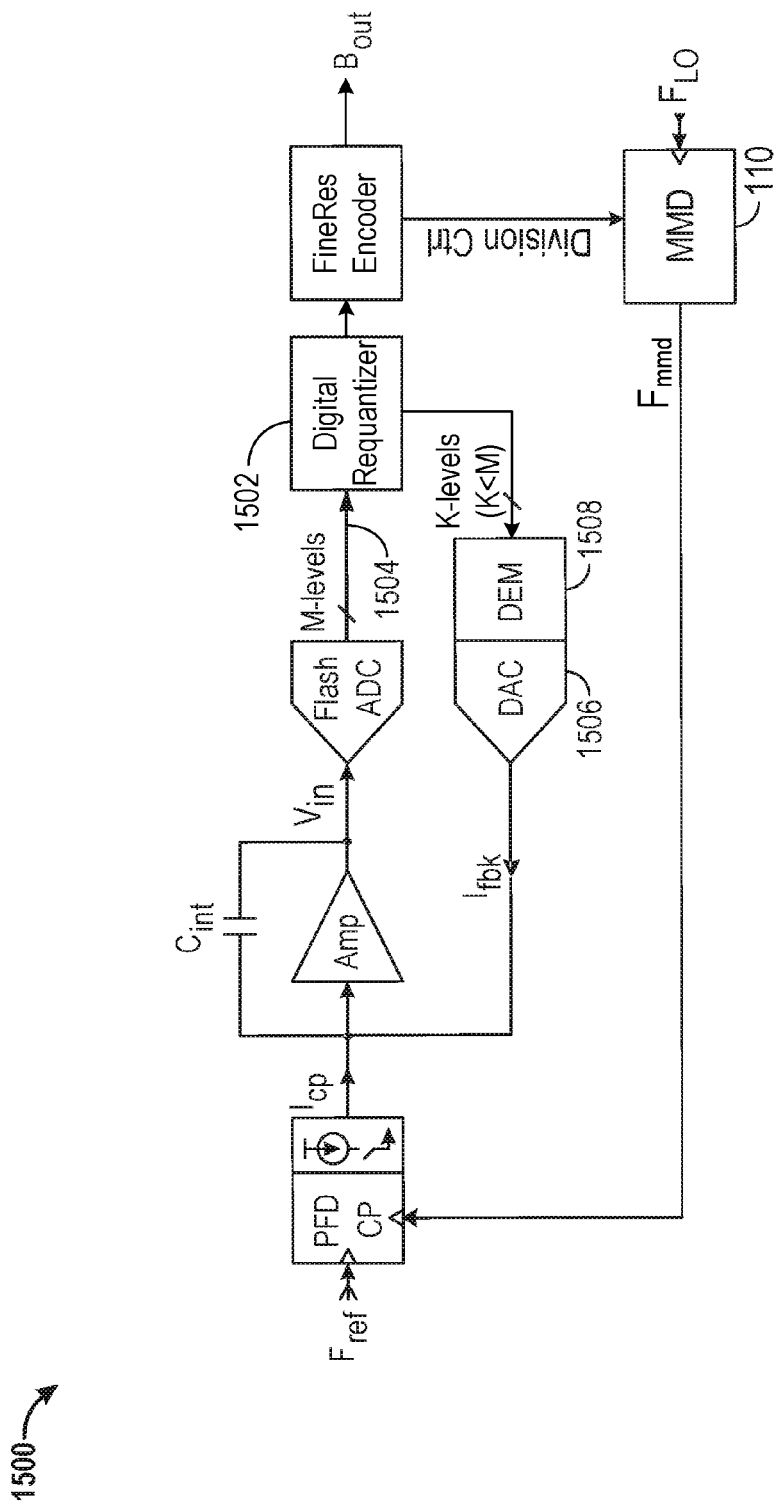
FIG. 10 shows an example of a hybrid 2nd-order delta sigma phase/frequency detector that includes digital requantizer.

FIG. 10 shows an example of a hybrid 2nd-order $\Delta\Sigma$ PFD 1500 that may be used in PLL 100 with reference to FIG. 1 that includes digital requantizer. The detector 1500 is a hybrid (mixed-analog/digital signal) 2nd-order $\Delta\Sigma$ PFD based on a continuous-time 1st-order $\Delta\Sigma$ ADC enhanced to 2nd-order via closed-loop frequency detection. The detector 1500 is digitally assisted with fine resolution encoding and a digital requantizer 1502 that operate on the $\Delta\Sigma$ ADC output 1504 for multi-level flash ADC configuration capability and low-complexity DEM 1508 feedback current-mode DAC 1506, respectively.

Figure 11:
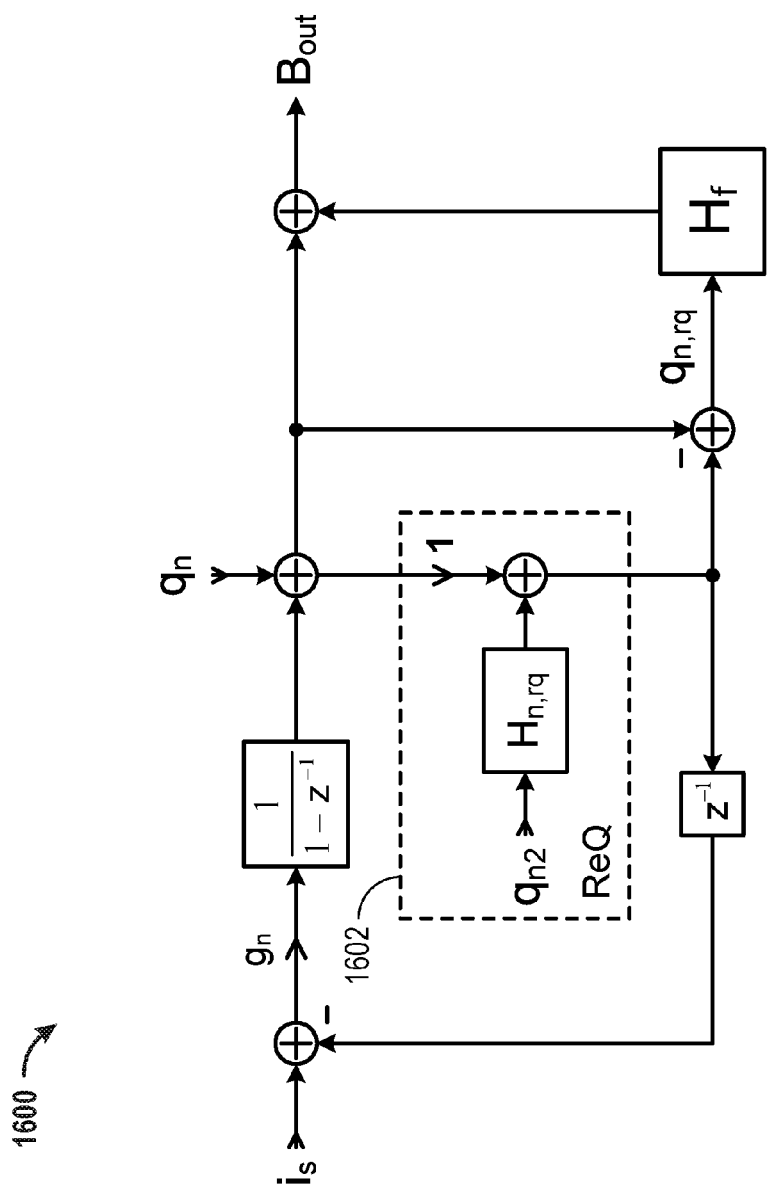
FIG. 11 shows a normalized discrete-time 1st-order delta sigma analog to digital converter model with re-quantization error cancellation.

FIG. 11 shows a normalized discrete-time 1st-order delta sigma analog to digital converter model 1600 with a noise shaping requantizer (ReQ) 1602 and re-quantization error cancellation. A noise shaping requantizer is utilized so that the re-quantization error does not mask the noise shaping performance of the $\Delta\Sigma$ ADC (e.g., 1st-order). The transfer function $H_{n,rq}$ represents the noise shaping characterisitcs of the requantizer and $q_{n2}$ represents the requantizer induced quantization noise. In the model 1600, the $\Delta\Sigma$ ADC input current signal $I_s$ and its induced fine (M-level) resolution quantization noise $Q_n$ are transferred to the output $B_{out}$ free from coarser (K-level) resolution re-quantization noise $Q_{n,rq}$. This may occur, for instance, when the following condition is satisfied:

$$H_f = z^{-1} H_s = z^{-1} \frac{g_n}{1-(1-g_n)z^{-1}}$$

where $H_s$ is the signal transfer function of the 1st-order $\Delta\Sigma$ ADC and $g_n$ the normalized integrator gain.

A typical bandwidth configuration of the $\Delta\Sigma$ ADC (e.g., several MHz range for $g_n > 0.5$) may exceed the PLL loop bandwidth (e.g., a few hundreds of kHz range) and for those frequencies $H_s$ is approximately 1. This allows the cancellation filter to be safely replaced by a delay element and the residual high frequency noise-shaped re-quantization error be rejected by the PLL loop filter.

Various implementations of the PLL 100 have been specifically described. However, many other implementations are also possible.

Figure 12:
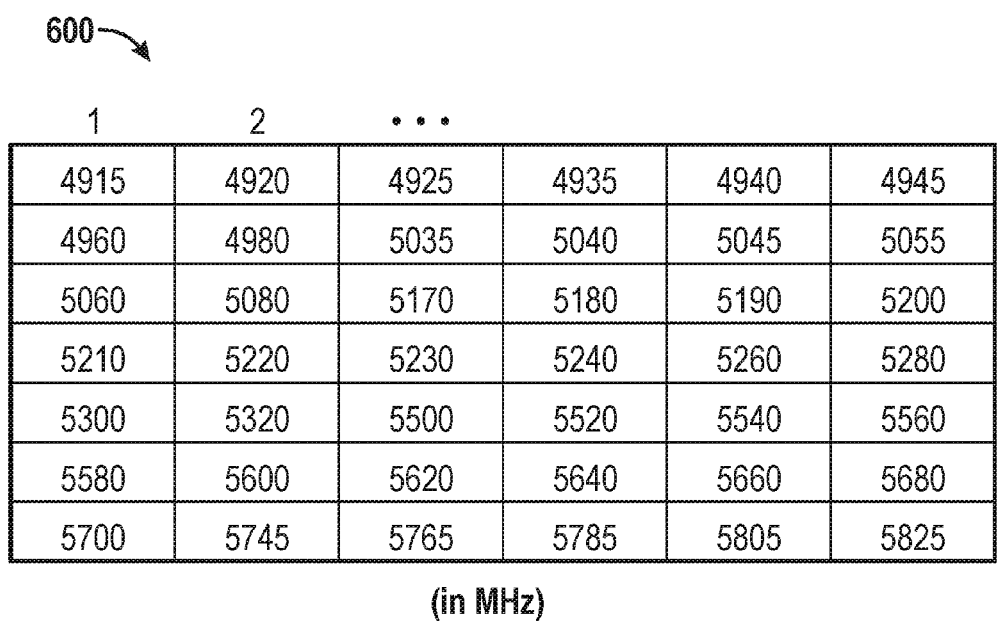
FIG. 12 shows selected WLAN 802.11ac channels between 4915 and 5825 MHz.

FIG. 12 shows examples of channel frequencies 600 in MHz that the PLL 100 may generate. One specific example is 4915 MHz (4.915 GHz). Note that the PLL 100 may generate any desired output frequencies, including those shown in FIG. 12. The output frequencies may vary widely according the particular system (e.g., a 3G or 4G cellular phone, or a Bluetooth or a WLAN transceiver) in which the PLL 100 is present.

Figure 13:
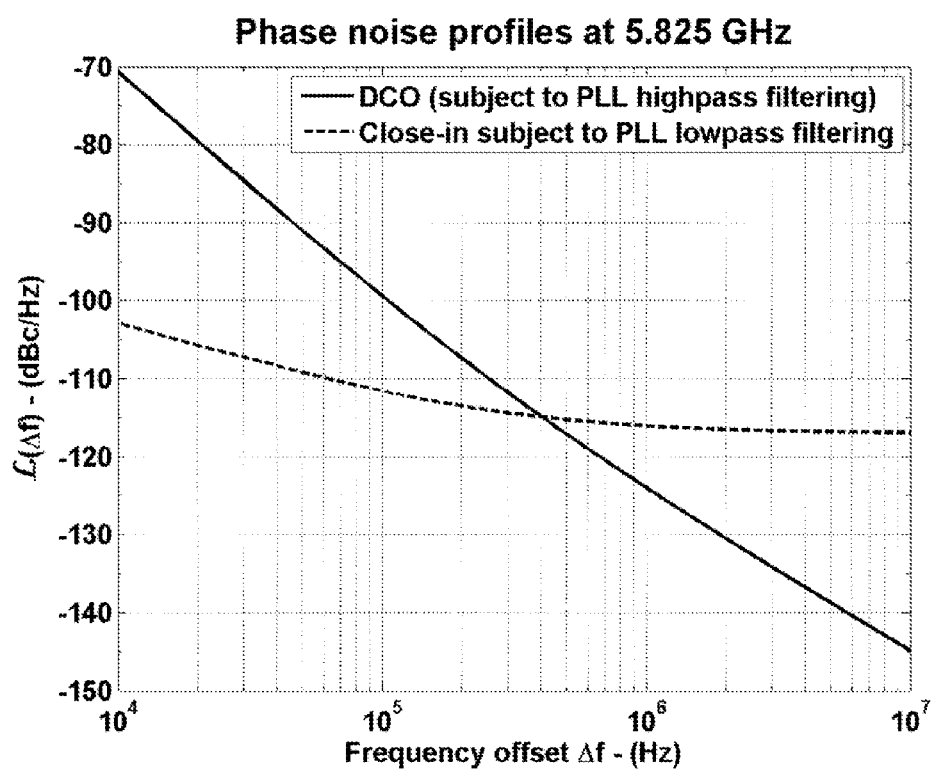
FIG. 13 shows example phase noise profiles.

FIG. 13 shows example phase noise profiles 700 for the PLL 100. The dataset is with reference to 5.825 GHz. The dataset shows the phase noise profile for the DCO 114 which is subject to the PLL highpass filtering functionality and the total close-in phase noise profile contributed from various noise sources of the PLL (e.g., Xtal clock, charge-pump, MMD, $\Delta\Sigma$ ADC) which are subject to the PLL lowpass filtering functionality.

Fine resolution encoding may generally refer to a quantization step $\Delta$ less than 1. The PLL 100 uses quantization steps less than one ($\Delta<1$) together with the fine resolution encoder 106 to interface the fractional valued $\Delta\Sigma$ ADC output with the MMD 110. The quantization step may be set according to a targeted PLL performance. Accordingly, even low-level fractional quantization may be sufficient for a target performance level, and finer grained fractional quantization may be implemented to reach higher target performance levels.

Figure 14:
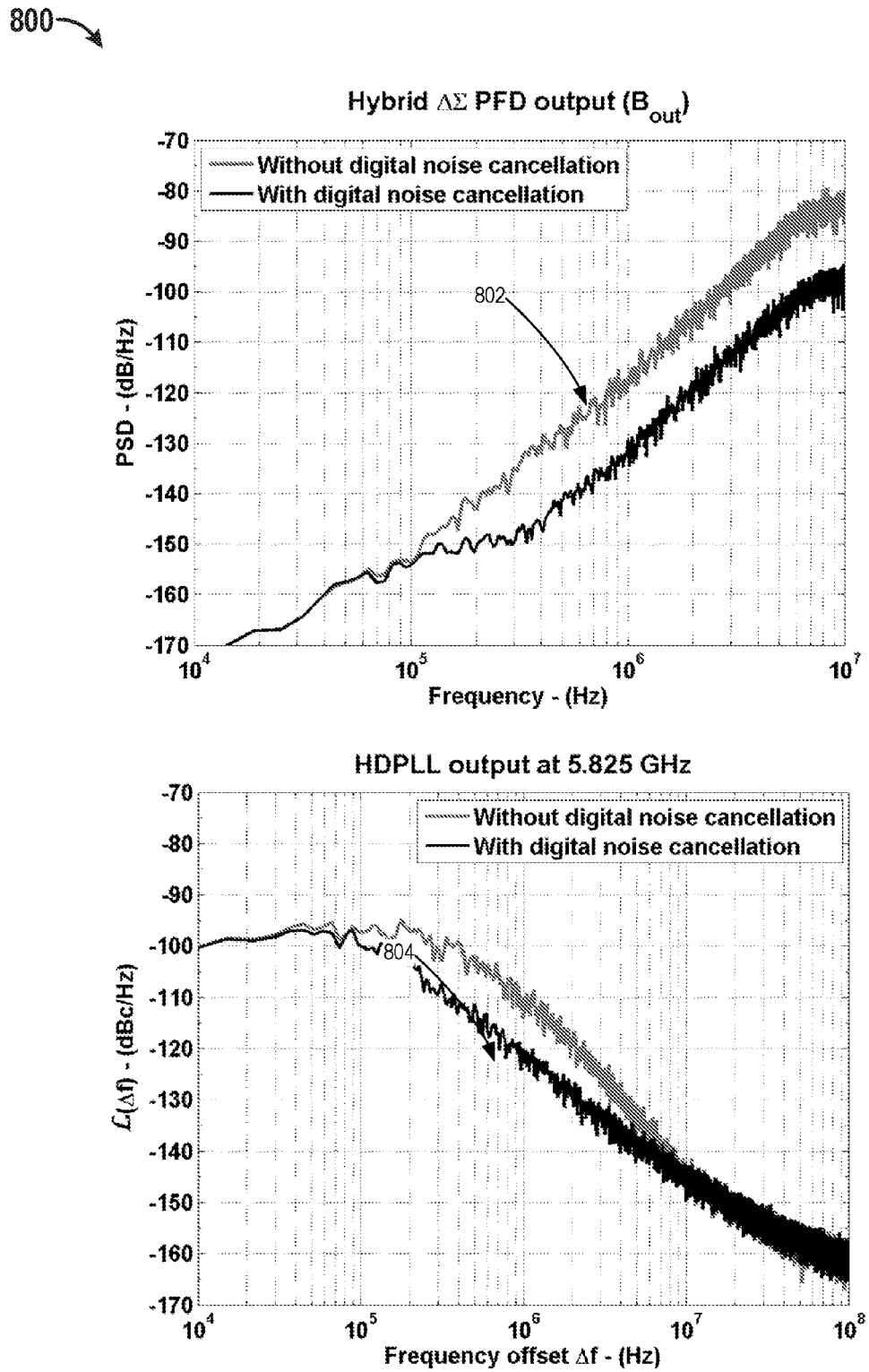
FIG. 14 shows HDPLL phase noise performance.

FIG. 14 shows PLL 100 phase noise performance 800 for channel frequency 5.825 GHz and a hybrid 2nd-order $\Delta\Sigma$ PFD with the configuration shown in FIG. 8. A 16-level flash ADC is assumed and a digital requantizer that drives a 5-level feedback DAC. Note the increased $\Delta\Sigma$ PFD output variance 802 and HDPLL output variance 804 in the absence of digital noise cancellation. That is without re-quantization (16-level to 5-level) error cancellation and dither DSP quantization noise cancellation.

Figure 15:
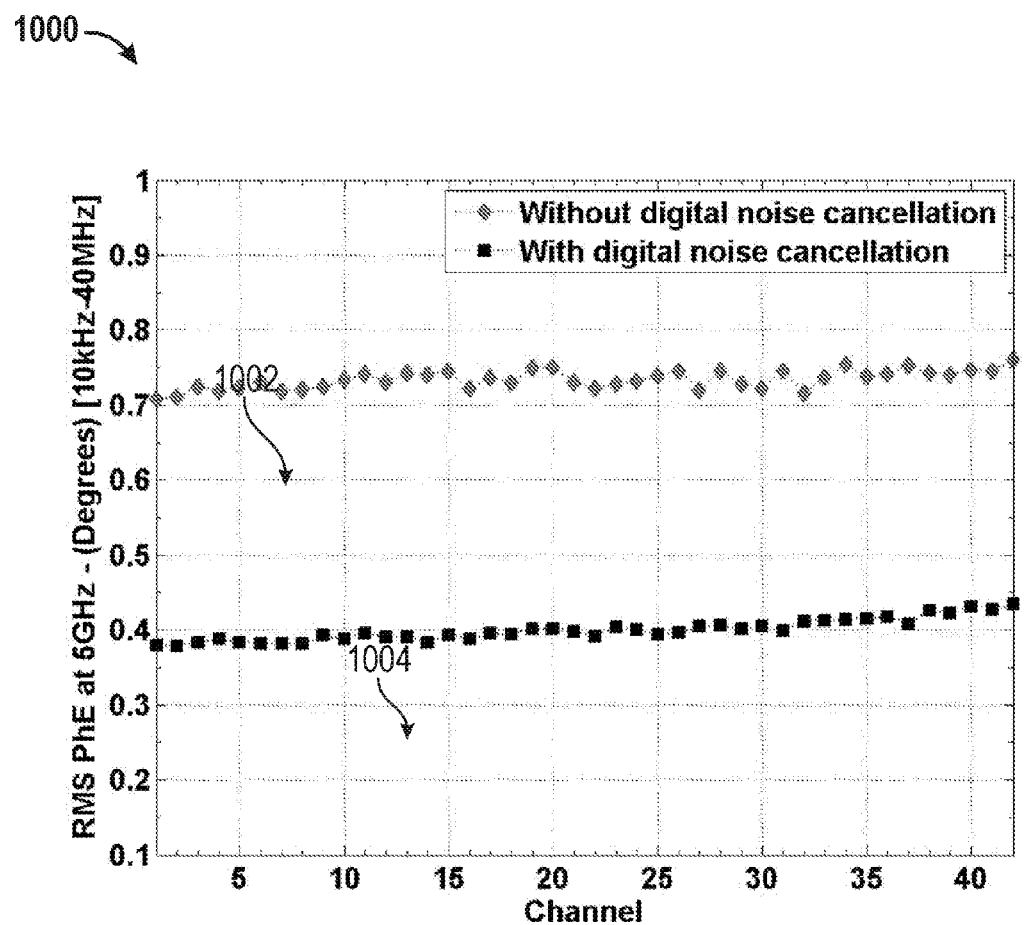
FIG. 15 shows HDPLL root-mean-square (RMS) phase error performance.

FIG. 15 shows HDPLL root-mean-square (RMS) phase error performance 1000. The phase error performance 1002 without digital noise cancellation is shown. Also shown is the phase error performance 1004 with digital noise cancellation which exhibits significantly reduced RMS phase error across all of the channels of interest.

What is claimed is:

1. A phase locked-loop (PLL) comprising:
a digitally controlled oscillator (DCO) configured to generate a DCO output frequency in response to a tuning input;
a frequency reference oscillator configured to generate a reference frequency input;
a mixed analog/digital signal Delta-Sigma ($\Delta\Sigma$) Phase/Frequency Detector ($\Delta\Sigma$ PFD) configured to generate a digital output of frequency difference between the reference frequency input and the DCO frequency output, the $\Delta\Sigma$ PFD comprising:
a digital requantizer configured to change a quantization resolution of a feedback portion of the digital output; and
a feedback path configured to receive the feedback portion after the quantization resolution is changed;
an accumulator configured to generate digital phase and frequency error information by accumulating the $\Delta\Sigma$ PFD digital output combined with a digital indicator of a targeted output frequency for the DCO; and
a loop filter following the accumulator and configured to tune phase/frequency of the DCO in response to digital phase and frequency error information.

2. The PLL of claim 1, where the $\Delta\Sigma$ comprises an analog to digital converter (ADC) for digitizing analog phase error and frequency error information.

3. The PLL of claim 2, where the ADC is configured to selectively operate in:
a fine resolution mode providing a fine mode number of quantization levels; and
a coarse resolution mode providing fewer quantization levels than the fine mode number of quantization levels.

4. The PLL of claim 3, where the coarse resolution mode provides at least two quantization levels and the fine resolution mode provides at least four quantization levels.

5. The PLL of claim 2, where the ADC comprises a Delta-Sigma ($\Delta\Sigma$) ADC.

6. The PLL of claim 5, where the $\Delta\Sigma$ PFD further comprises a charge-pump configured to drive the $\Delta\Sigma$ ADC.

7. The PLL of claim 6, where the $\Delta\Sigma$ PFD further comprises a multi-modulus divider (MMD) configured to receive and divide the DCO output frequency.

8. The PLL of claim 7, where $\Delta\Sigma$ PFD further comprises a fine resolution encoder circuit configured to interface the $\Delta\Sigma$ ADC output to a control input of the MMD.

9. The PLL of claim 8, where the $\Delta\Sigma$ PFD comprises a phase and frequency detector (PFD) charge-pump front-end driven by the reference frequency input and a feedback output of the MMD.

10. The PLL of claim 9, where the PFD charge-pump front-end drives a $\Delta\Sigma$ ADC in communication with the fine resolution encoder.

11. The PLL of claim 1, where the detector comprises an adaptive filter configured to cancel noise affecting the detector.

12. A method comprising:
performing phase/frequency detection with respect to a reference frequency and a feedback signal;
performing digital requantization between a fine resolution analog-to-digital conversion for the phase/frequency detection and a course resolution digital-to-analog conversion for interfacing with the feedback signal;
generating a multiple bit error encoding of phase/frequency error responsive to the detection;
receiving the multiple bit error encoding at a loop filter; and
controlling a digitally controlled oscillator (DCO) with the loop filter to generate a reference frequency output.

13. The method of claim 12, further comprising:
generating the feedback signal by applying a multi-modulus divider (MMD) to the reference frequency output.

14. The method of claim 13, further comprising:
dithering the multiple bit error encoding to interface the MMD.

15. The method of claim 12, further comprising:
prior to performing digital requantization, configuring an analog-to-digital converter (ADC) to generate the fine resolution analog-to-digital conversion characterized by a greater quantization resolution than the coarse resolution digital-to-analog conversion.

16. The method of claim 12, further comprising:
performing adaptive noise filtering and cancellation of noise affecting the phase/frequency detection.

17. A phase locked loop (PLL) comprising:
a reference frequency input;
a phase and frequency detector charge-pump in communication with the reference frequency input;
a delta sigma analog-to-digital converter (ADC) driven by the charge-pump, the ADC comprising a resolution mode input configured to selectively change the ADC between:
   a fine resolution mode providing a fine mode number of quantization levels for phase and frequency error; and
   a coarse resolution mode providing fewer quantization levels for the phase and frequency error than the fine mode number of quantization levels;
a loop filter following the ADC and configured to accept the phase and frequency error and responsively drive a digitally controlled oscillator (DCO) that generates a reference frequency output; and
a feedback path from the DCO to the charge-pump, the feedback path comprising a multi-modulus divider (MMD).

18. The PLL of claim 17, further comprising a dither circuit configured to interface the fine mode number of quantization levels to a lower-resolution MMD control grid of the MMD.

19. The PLL of claim 1, where the accumulator further comprises an input configured to receive a phase lock signal to selectively disable the accumulator.

20. The method of claim 16, where:
performing adaptive noise filtering and cancellation comprises applying an adaptive algorithm to determine filter coefficients; and
the adaptive algorithm comprises a Least Mean Squares algorithm, a Recursive Least Squares algorithm, or both.

21. A phase locked loop (PLL) comprising:
a reference frequency input;
a detector in communication with the reference frequency input, the detector comprising:
   a fine resolution encoder configured to output a multiple bit resolution phase/frequency error encoding; and
   a phase and frequency detector including an analog to digital converter (ADC), the ADC is configured to selectively operate in:
      a fine resolution mode providing a fine mode number of quantization levels; and
      a coarse resolution mode providing fewer quantization levels than the fine mode number of quantization levels;
a loop filter following the detector and configured to accept the multiple bit resolution error encoding; and
a reference frequency output following the loop filter.

* * * * *

UNITED STATES PATENT AND TRADEMARK OFFICE
CERTIFICATE OF CORRECTION

PATENT NO.        : 9,319,051 B2
APPLICATION NO.   : 14/283652
DATED             : April 19, 2016
INVENTOR(S)       : Ioannis Loukas Syllaios et al.

It is certified that error appears in the above-identified patent and that said Letters Patent is hereby corrected as shown below:

In the Claims

In column 8, claim 12, line 55, after "detection and a" replace "course" with --coarse--.

Signed and Sealed this
Twenty-fourth Day of May, 2016

Michelle K. Lee
*Director of the United States Patent and Trademark Office*